United States Patent
Lee et al.

(10) Patent No.: US 8,476,751 B2
(45) Date of Patent: Jul. 2, 2013

(54) STACKED SEMICONDUCTOR PACKAGE AND METHOD FOR MANUFACTURING THE SAME

(75) Inventors: Kyu Won Lee, Seoul (KR); Cheol Ho Joh, Seoul (KR); Eun-Hye Do, Suwon-si (KR); Ji Eun Kim, Suwon-si (KR); Hee Min Shin, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 151 days.

(21) Appl. No.: 13/096,143

(22) Filed: Apr. 28, 2011

(65) Prior Publication Data

US 2011/0272820 A1 Nov. 10, 2011

(30) Foreign Application Priority Data

May 6, 2010 (KR) ........................ 10-2010-0042457

(51) Int. Cl.
*H01L 23/02* (2006.01)

(52) U.S. Cl.
USPC .... 257/686; 257/774; 257/776; 257/E23.011; 438/107; 438/109; 438/118; 438/667

(58) Field of Classification Search
USPC .. 257/686, 774, 776–778, E23.011; 438/107, 438/109, 118, 667, 613
See application file for complete search history.

(56) References Cited

U.S. PATENT DOCUMENTS

| 7,652,362 B2 | 1/2010 | Jung et al. | |
|---|---|---|---|
| 2007/0228544 A1* | 10/2007 | Jung et al. | 257/686 |
| 2008/0017971 A1 | 1/2008 | Hollis | |
| 2008/0032448 A1* | 2/2008 | Simon et al. | 438/107 |

FOREIGN PATENT DOCUMENTS

| KR | 1020070097802 A | 10/2007 |
|---|---|---|
| KR | 1020100019635 A | 2/2010 |

* cited by examiner

*Primary Examiner* — Evan Pert
*Assistant Examiner* — Mark A Laurenzi
(74) *Attorney, Agent, or Firm* — William Park & Associates Patent Ltd.

(57) ABSTRACT

A stacked semiconductor package includes a semiconductor package module including a plurality of semiconductor packages each of which has a first surface, a second surface facing away from the first surface, side surfaces connecting the first surface and the second surface and through-holes formed on the side surfaces to pass through the first surface and the second surface and which are stacked such that their through-holes vertically connect with one another, and adhesive members which are formed between the semiconductor packages and attach the semiconductor packages to one another, a main substrate supporting the semiconductor package module and formed, on a third surface thereof facing the semiconductor package module, with main connection pads which are aligned with the through-holes, and conductive connection members formed in the through-holes and electrically connecting the semiconductor packages with the main connection pads.

13 Claims, 14 Drawing Sheets

US 8,476,751 B2

STACKED SEMICONDUCTOR PACKAGE AND METHOD FOR MANUFACTURING THE SAME

CROSS-REFERENCE TO RELATED APPLICATIONS

The present application claims priority to Korean patent application number 10-2010-42457 filed on May 6, 2010, which is incorporated herein by reference in its entirety.

BACKGROUND OF THE INVENTION

The present invention relates to a stacked semiconductor package and a method for manufacturing the same.

In the semiconductor industry, packaging technologies for semiconductor integrated circuits have continuously are being developed to meet the demands toward miniaturization and mounting efficiency. For example, the demand for miniaturization is accelerating the development of technologies for a package having a size approaching to that of a chip, and the demand for mounting reliability is highlighting the importance of packaging technologies for improving the efficiency of mounting work and mechanical and electrical reliability after mounting. Also, as miniaturization and high performance are demanded in electric and electronic products, stacking technologies have been suggested in the art and are currently being developed into various styles.

The term "stack" referred to in the semiconductor industry means a technology of vertically piling at least two semiconductor chips or semiconductor packages. By using the stack technology, for example, a 512M DRAM may be configured by stacking two 256M DRAMs. Further, since a stacked semiconductor package provides advantages in terms of memory capacity, mounting density and mounting area utilization efficiency, search and development of stacked semiconductor packages are being accelerated.

FIG. 1 is a cross-sectional view illustrating a known POP (Package On Package) type stacked semiconductor package. A lower package 20 and an upper package 30 are stacked on a main substrate 10 while electrically connected by solder balls 41 and 42.

In detail, the main substrate 10 and the lower package 20 are electrically connected with each other by the solder balls 41 which are formed between ball land patterns 11 formed on the upper surface of the main substrate 10 and ball land patterns 23A formed on the lower surface of a substrate 21 of the lower package 20, and the lower package 20 and the upper package 30 are electrically connected with each other by the solder balls 42 which are formed between ball land patterns 23B formed on the upper surface of the substrate 21 of the lower package 20 and ball land patterns 33 formed on the lower surface of a substrate 31 of the upper package 30.

The unexplained reference numerals 22, 24, 25 and 26 respectively designate a first semiconductor chip, a first adhesive member, first bonding wires and a lower mold part which constitute the lower package 20, and the unexplained reference numerals 32, 34, 35 and 36 respectively designate a second semiconductor chip, a second adhesive member, second bonding wires and an upper mold part which constitute the upper package 30.

However, in the known stacked semiconductor package, warpage may occur in the main substrate 10, the lower package 20 and the upper package 30 when performing a reflow process for the solder balls 41 and 42, and due to the occurrence of warpage, cracks may occur in the solder balls 41 and 42. The occurrence of cracks may lead to the occurrence of fails, whereby the manufacturing yield and the productivity may deteriorate.

BRIEF SUMMARY OF THE INVENTION

Embodiments of the present invention are directed to a stacked semiconductor package and a method for manufacturing the same which can suppress the occurrence of a fail.

In an exemplary embodiment of the present invention, a stacked semiconductor package includes a semiconductor package module including a plurality of semiconductor packages each of which has a first surface, a second surface facing away from the first surface, side surfaces connecting the first surface and the second surface and through-holes formed on the side surfaces to pass through the first surface and the second surface and which are stacked such that their through-holes vertically connect with one another, and adhesive members which are formed between the semiconductor packages and attach the semiconductor packages to one another, a main substrate supporting the semiconductor package module and formed, on a third surface thereof facing the semiconductor package module, with main connection pads which are aligned with the through-holes, and conductive connection members formed in the through-holes and electrically connecting the semiconductor packages with the main connection pads.

In another exemplary embodiment of the present invention, a method for manufacturing a stacked semiconductor package includes the steps of forming a plurality of semiconductor packages each having a first surface, a second surface facing away from the first surface and side surfaces connecting the first surface and the second surface, and formed, on the side surfaces, with through-holes which pass through the first surface and the second surface, attaching first adhesive members to second surfaces of the semiconductor packages in such a way as to partially cover cross-sections of through-holes which are open on the second surfaces of the semiconductor packages, inserting solder balls into the through-holes, stacking the semiconductor packages on a main substrate formed with main connection pads such that the through-holes of the semiconductor packages vertically connect with one another, and reflowing the solder balls and thereby forming conductive connection members which electrically connect the semiconductor packages with the main connection pads.

In another exemplary embodiment of the present invention, a stacked semiconductor package includes a plurality of semiconductor package modules each including a plurality of semiconductor packages each of which has a first surface, a second surface facing away from the first surface, side surfaces connecting the first surface and the second surface and through-holes formed on the side surfaces to pass through the first surface and the second surface and which are stacked such that their through-holes vertically connect with one another and adhesive members which are formed between the semiconductor packages and attach the semiconductor packages to one another, and formed adjoining one another in a matrix type such that through-holes of the semiconductor packages, which connect in a vertical direction, connect in a horizontal direction, a main substrate supporting the semiconductor package modules and formed, on a third surface thereof facing the semiconductor package modules, with main connection pads which are aligned with the through-holes communicating in the vertical direction; and conductive connection members formed in the through-holes and electrically connecting the semiconductor packages with the main connection pads.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
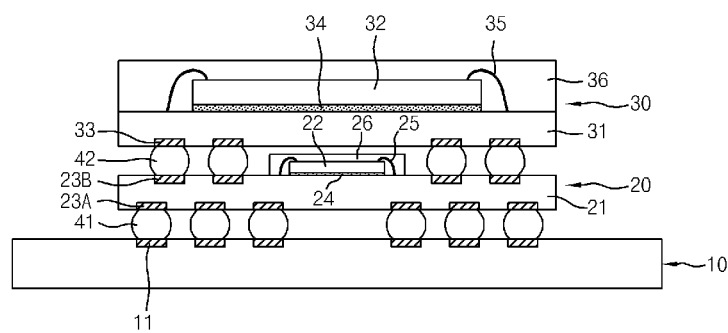
FIG. 1 is a cross-sectional view illustrating a known POP type stacked semiconductor package.
Figure 2:
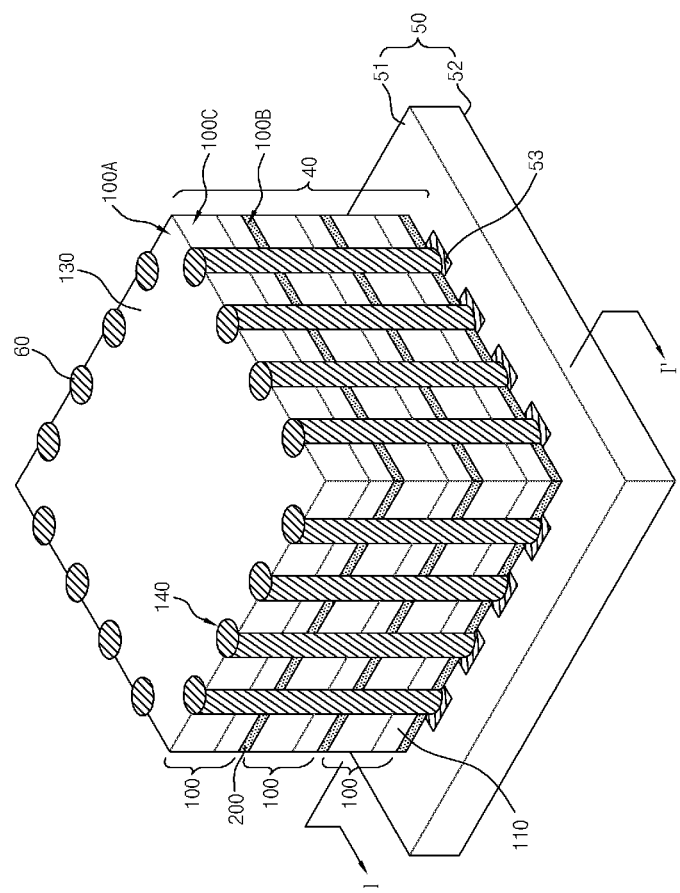
FIG. 2 is a perspective view illustrating a stacked semiconductor package in accordance with an exemplary embodiment of the present invention.
Figure 3:
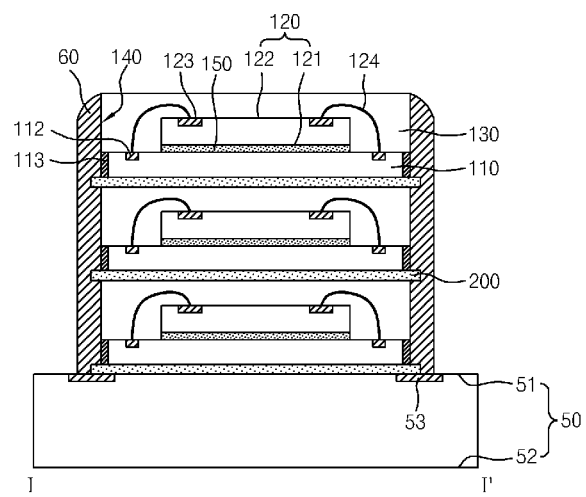
FIG. 3 is a cross-sectional view taken along the line I-I' of FIG. 2.
Figure 4:
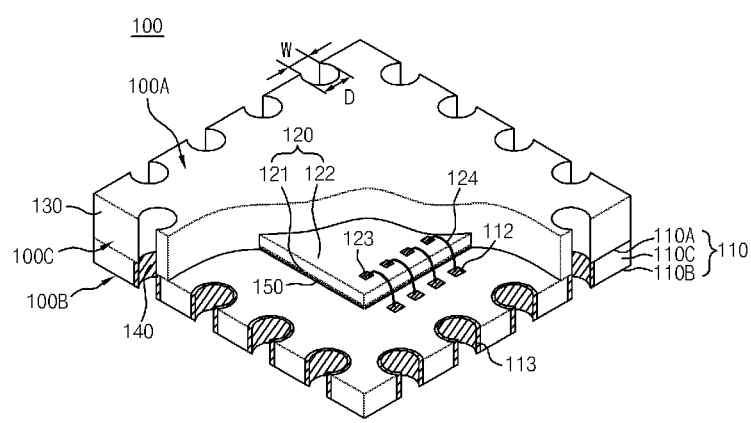
FIG. 4 is a partially broken-away perspective view of the semiconductor package shown in FIG. 2.

FIG. 2 is a perspective view illustrating a stacked semiconductor package in accordance with an exemplary embodiment of the present invention, FIG. 3 is a cross-sectional view taken along the line I-I' of FIG. 2, and FIG. 4 is a partially broken-away perspective view of the semiconductor package shown in FIG. 2.

Referring to FIGS. 2 and 3, a stacked semiconductor package in accordance with an exemplary embodiment of the present invention includes a semiconductor package module 40, a main substrate 50, and conductive connection members 60.

The semiconductor package module 40 includes a plurality of semiconductor packages 100 and first adhesive members 200. In the present exemplary embodiment, the semiconductor package module 40 includes three semiconductor packages 100.

Referring to FIG. 4, each semiconductor package 100 has a first surface 100A, a second surface 100B which faces away from the first surface 100A, and side surfaces 100C which connect the first surface 100A and the second surface 100B. In the present exemplary embodiment, each semiconductor package 100 has a rectangular hexahedral shape. The semiconductor package 100 having a rectangular hexahedral shape has four side surfaces 100C. Through-holes 140 are formed on the side surfaces 100C of the semiconductor package 100 in such a way as to pass through the first surface 100A and the second surface 100B. In the present exemplary embodiment, the through-holes 140 are formed in a plural number on the side surfaces 100C of the semiconductor package 100. Each of the through-holes 140 may have a shape of a circular column.

According to an example, an inner diameter D of the through-holes 140 has a size that is larger than the diameter of solder balls, so that the solder balls can be inserted into the through-holes 140. Also, in order to prevent the inserted solder balls from moving out of the through-holes 140, an open width W of the through-holes 140, by which the through-holes 140 are open on the side surfaces 100C of the semiconductor package 100, has a size that is smaller than the diameter of the solder balls and the inner diameter D of the through-holes 140. For example, the open width W of the through-holes 140 may be approximately 10% to 50% of the inner diameter D of the through-holes 140. While the through-holes 140 have the shape of a circular column in the present exemplary embodiment, the through-holes 140 may have a shape of a prism with at least three sides.

In the present exemplary embodiment, the semiconductor package 100 includes a substrate 110 and a mold part 130 through which the through-holes 140 are formed, and a semiconductor chip 120.

According to an example, the substrate 110 has a shape of a quadrangular plate. The substrate 110 has a fifth surface 110A, a sixth surface 110B which faces away from the fifth surface 110A, and four side surfaces 110C which connect the fifth surface 110A and the sixth surface 110B.

Connection pads 112 are formed on the fifth surface 110A of the substrate 110, and side pads 113 are formed on the inner walls of the through-holes 140 formed on the side surfaces 110C of the substrate 110. While not shown in a drawing, the substrate 110 may include therein circuit patterns (not shown) which are formed to constitute multiple layers and vias (not shown) which electrically connect the circuit patterns formed on different layers. The connection pads 112 and the side pads 113 may be electrically connected with each other through the circuit patterns and vias which are formed in the substrate 110.

The semiconductor chip 120 has a seventh surface 121 which faces the substrate 110 and an eighth surface 122 which faces away from the seventh surface 121.

The seventh surface 121 of the semiconductor chip 120 is attached to the fifth surface 110A of the substrate 110 with a second adhesive member 150, and bonding pads 123, which are connected with the connection pads 112 of the substrate 110, are formed on the eighth surface 122 of the semiconductor chip 120. While not shown in a drawing, a circuit unit (not shown), which is constituted by transistors, capacitors, resistors, and so forth to store and process data, is formed in the semiconductor chip 120, and the bonding pads 123 serve as electrical contacts of the circuit unit, for connection to an outside.

In the present exemplary embodiment, the connection pads 112 of the substrate 110 and the bonding pads 123 of the semiconductor chip 120 are connected with each other by bonding wires 124. While, in the present exemplary embodiment, the substrate 110 and the semiconductor chip 120 are connected with each other in a wire bonding type by using the bonding wires 124, the substrate 110 and the semiconductor chip 120 may be connected with each other in a flip-chip bonding type.

The mold part 130 seals the fifth surface 110A of the substrate 110 including the semiconductor chip 120 and the bonding wires 124.

Referring back to FIGS. 2 and 3, the plurality of semiconductor packages 100 are stacked such that the through-holes 140 are vertically aligned with one another, and thereby, constitute the semiconductor package module 40.

The first adhesive members 200 are formed between the stacked semiconductor packages 100. Each first adhesive member 200 attaches the second surface 100B of an upwardly positioned semiconductor package 100 and the first surface 100A of a downwardly positioned semiconductor package 100 to each other.

The first adhesive members 200 are formed in such a way as to partially cover the cross-sections of the through-holes 140 which are open on the first surfaces 100A and the second surfaces 100B of the semiconductor packages 100. For example, the first adhesive members 200 are formed to cover approximately 20% to 50% of the cross-sections of the through-holes 140. The first adhesive members 200 function to support the solder balls inserted into the through-holes 140 so as to prevent the solder balls from moving out of the through-holes 140.

The first adhesive members 200 may be formed as flexible adhesive sheets. As the adhesive sheets, for example, a WBL (wafer backside lamination) film, a spacer tape, and a prepreg may be used.

The main substrate 50 supports the semiconductor package module 40.

The semiconductor package module 40 is attached to the main substrate 50 with the first adhesive member 200 which is attached to the second surface 100B of the semiconductor package 100 positioned lowermost.

The main substrate 50 has a third surface 51 which faces the semiconductor package module 40 and a fourth surface 52 which faces away from the third surface 51. Main connection pads 53 are formed on the third surface 51 of the main substrate 50 in such a way as to be aligned with the through-holes 140.

The conductive connection members 60 are formed in the through-holes 140 which electrically connect the stacked semiconductor packages 100 with the main connection pads 53 of the main substrate 50. In the present exemplary embodiment, the conductive connection members 60 electrically connect the side pads 113 which are formed on the side surfaces 110C of the substrates 110 of the stacked semiconductor packages 100 with the main connection pads 53 of the main substrate 50.

The conductive connection members 60 may be formed by vertically stacking the semiconductor packages 100, with the solder balls inserted into the through-holes 140, on the third surface 51 of the main substrate 50 and by melting the solder balls through a reflow process.

While not shown in a drawing, in the case of a semiconductor package 100 which should be electrically isolated from the conductive connection members 60, insulation balls may be inserted, instead of the solder balls, into the through-holes 140 which are formed in the corresponding semiconductor package 100 such that the side pads 113 formed on the side surfaces 110C of the substrate 110 of the corresponding semiconductor package 100 are electrically isolated from the conductive connection members 60. Here, silica balls may be used as the insulation balls.

A method for manufacturing the stacked semiconductor package having the above-mentioned construction will be described below.

FIGS. 5 through 12 are views explaining a method for manufacturing the stacked semiconductor package in accordance with the above-described exemplary embodiment of the present invention.

Figure 5:
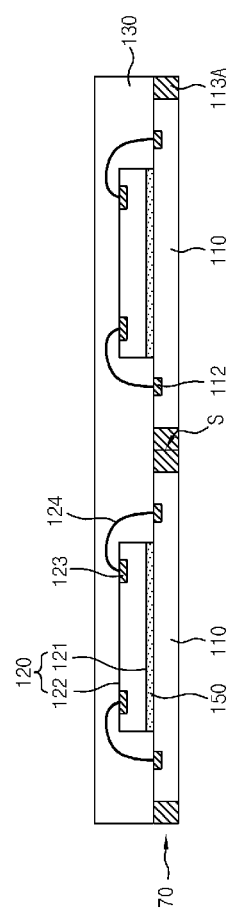
FIGS. 5 through 12 are views explaining a method for manufacturing the stacked semiconductor package shown in FIG. 2.
Figure 6:
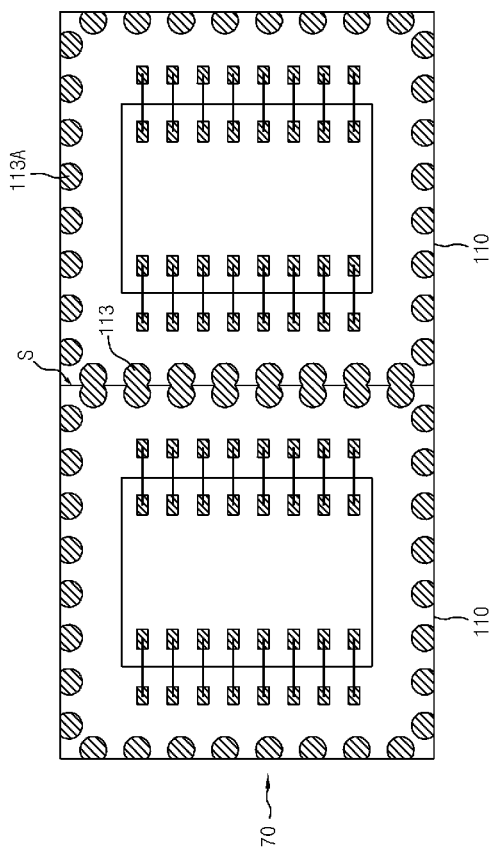
Figure 7:
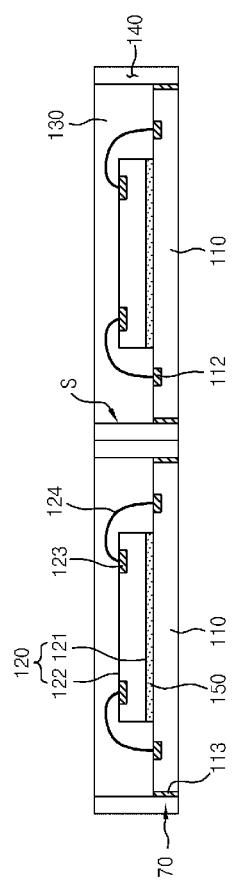
Figure 8:
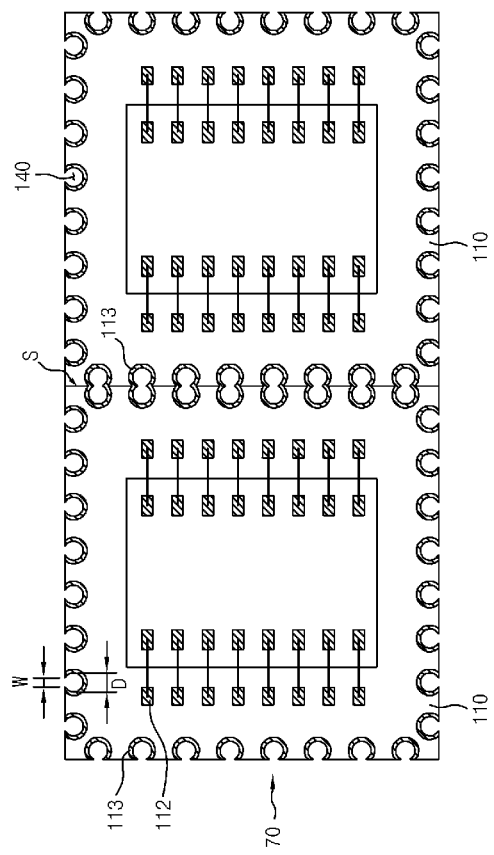
Figure 9:
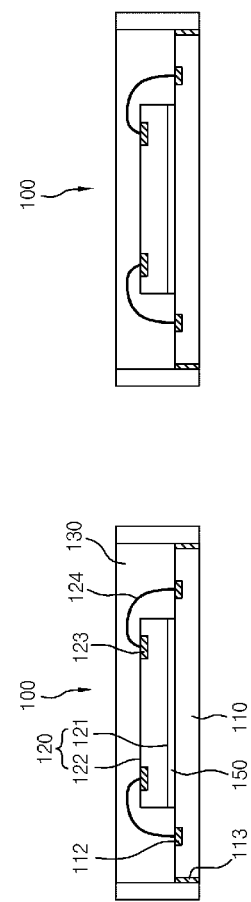
Figure 10:
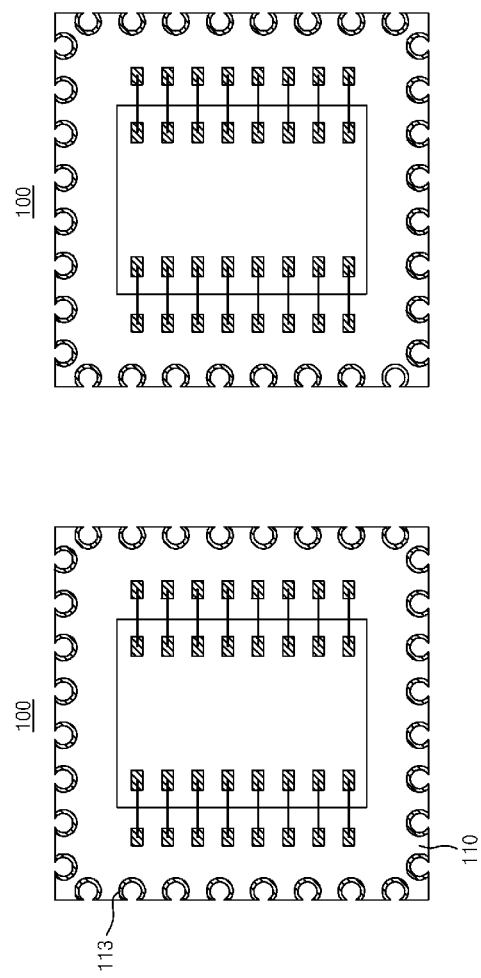

FIGS. 5, 7, 9, 11 and 12 are cross-sectional views according to a processing sequence, and FIGS. 6, 8 and 10 are plan views of FIGS. 5, 7 and 9. For the sake of easy understanding, mold parts 130 are not shown in FIGS. 6, 8 and 10.

Referring to FIGS. 5 and 6, a strip level substrate 70, having a plurality of unit level substrates 110 each of which has a fifth surface 110A and a sixth surface 110B facing away from the fifth surface 110A and is formed with connection pads 112 on the fifth surface 110A thereof and with conductive layers 113A for side pads on the side surfaces thereof, is prepared.

Adjoining unit level substrates 110 are connected to each other along a sawing line S, and the conductive layers 113A for side pads, of the adjoining unit level substrates 110, are coupled with each other.

While not shown in a drawing, each unit level substrate 110 may include therein circuit patterns (not shown) which are formed to constitute multiple layers and vias (not shown) which electrically connect the circuit patterns formed on different layers. The connection pads 112 and the conductive layers 113A for side pads may be electrically connected with each other through the circuit patterns and vias which are formed in the unit level substrate 110.

A semiconductor chip 120 is attached onto each unit level substrate 110 with a second adhesive member 150, and bonding pads 123 of the semiconductor chip 120 and the connection pads 112 of the unit level substrate 110 are connected with each other by the bonding wires 124.

By forming a mold part 130 which seals the fifth surfaces 110A of the unit level substrates 110 including the bonding wires 124 and the semiconductor chips 120, a plurality of strip level semiconductor packages 100 are formed.

Referring to FIGS. 7 and 8, through-holes 140 are formed through the strip level substrate 70 and the mold part 130 to pass through the conductive layers 113A for side pads, of the unit level substrates 110. The through-holes 140 may be formed through a drilling process or a laser drilling process.

An open width W of the through-holes 140 by which the through-holes 140 are open on the side surfaces of the unit level substrates 110 is determined to have a size that is smaller than an inner diameter D of the through-holes 140 and the diameter of solder balls which are to be inserted into the through-holes 140. The conductive layers 113A for side pads are not completely removed and remain in the through-holes 140. By the conductive layers 113A for side pads which remain in this way, side pads 113 are formed on the inner walls of the through-holes 140 of the unit level substrates 110.

While the through-holes 140 formed in the unit level substrate 110 have the substantial shape of a circular column in the present exemplary embodiment, the through-holes 140 may have a shape of a prism with at least three sides.

Referring to FIGS. 9 and 10, by cutting the strip level substrate 70 and the mold part 130 along the sawing line S, the semiconductor packages 100 are individualized.

Figure 11:
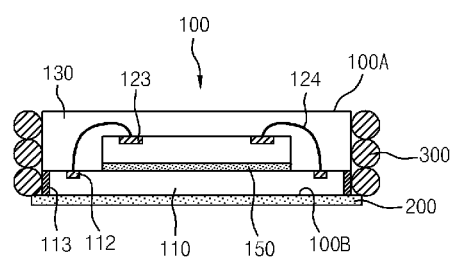

Referring to FIG. 11, a first adhesive member 200 is attached to a surface of the individualized semiconductor package 100. Hereafter, the surface of the semiconductor package 100, to which the first adhesive member 200 is attached, is formed as a second surface 100B, and the other surface of the semiconductor package 100, which faces away from the second surface 100B, is formed as a first surface 100A.

The first adhesive member 200 is formed in such a way as to partially cover the cross-sections of the through-holes 140 which are open on the second surface 100B of the semiconductor package 100. For example, the first adhesive member 200 is formed to cover approximately 20% to 50% of the cross-sections of the through-holes 140 which are open on the second surface 100B of the semiconductor package 100.

The first adhesive member 200 may be formed as a flexible adhesive sheet. As the adhesive sheet, for example, a WBL (wafer backside lamination) film, a spacer tape, and a prepreg may be used.

Solder balls 300 are inserted into the through-holes 140. The solder balls 300, which are inserted into the through-holes 140, are supported by the first adhesive member 200 and do not move downward out of the through-holes 140. Since the open width W of the through-holes 140 by which the through-holes 140 are open on the side surfaces of the semiconductor package 100 is determined to have a size that is smaller than the diameter of solder balls 300, the solder balls 300 inserted into the through-holes 140 do not move sideward, as well, out of the through-holes 140, and remain inserted into the through-holes 140.

While not shown in a drawing, insulation balls are inserted, instead of the solder balls 300, into the through-holes 140 formed on the side surfaces of the semiconductor package 100 which need not be electrically connected. Here, silica balls may be used as the insulation balls.

Figure 12:
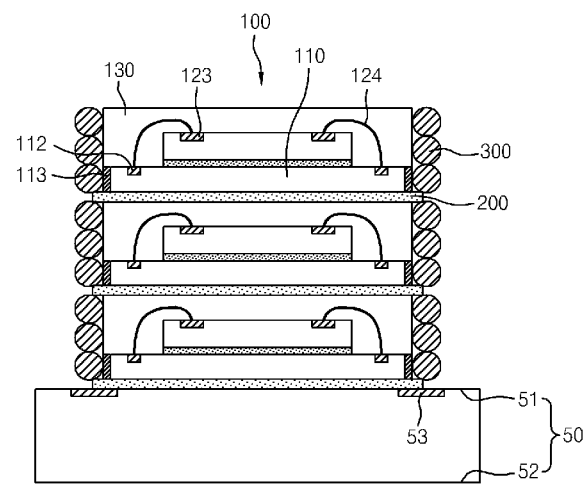

Referring to FIG. 12, the semiconductor packages 100 are stacked on a third surface 51 of a main substrate 50 on which main connection pads 53 are formed in such a manner that the through-holes 140 are vertically aligned with the main connection pads 53. The semiconductor packages 100 are vertically stacked on and attached to one another with first adhesive members 200 which are formed on second surfaces 100B of the semiconductor packages 100, and are attached to the main substrate 50 with the first adhesive member 200 which is attached to the semiconductor package 100 positioned lowermost.

Referring back to FIGS. 2 and 3, by melting the solder balls 300 through a reflow process, conductive connection members 60 are formed in such a way as to electrically connect the side pads 113 formed in the substrates 110 of the semiconductor packages 100 with the main connection pads 53.

As the solder balls 300 are melted and flow downward during the reflow process, the conductive connection members 60 may not be formed in the through-holes 140 of upwardly stacked semiconductor packages 100. In this case, solder balls 300 are additionally inserted into the through-holes 140 after performing the reflow process, and the reflow process is performed again.

While it was described in the above exemplary embodiment that the solder balls 300 inserted into the through-holes 140 of the plurality of semiconductor packages 100 are melted at a time by performing the reflow process after stacking the plurality of semiconductor packages 100 on the main substrate 50, the reflow process may be performed at each time of stacking each semiconductor package 100 so that the solder balls 300 can be melted by a semiconductor package 100.

Figure 13:
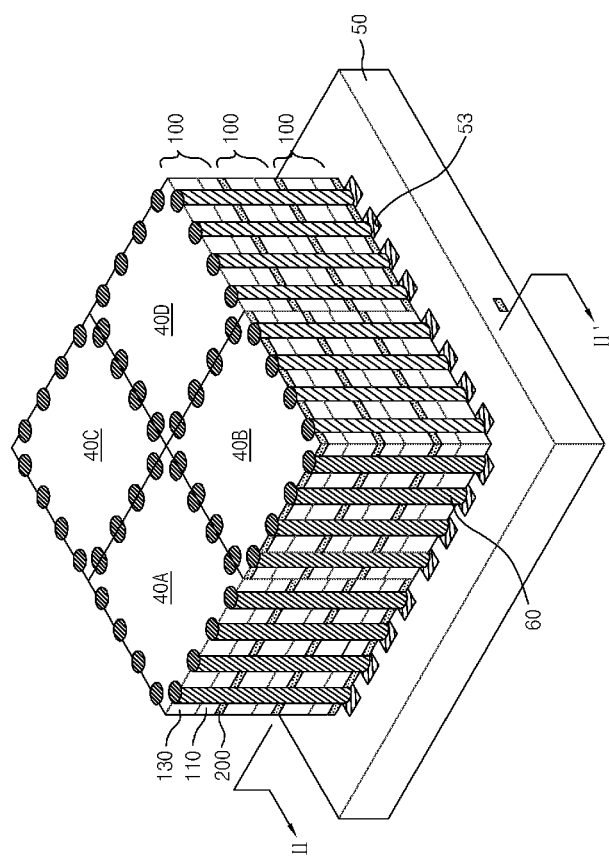
FIG. 13 is a perspective view illustrating a stacked semiconductor package in accordance with another exemplary embodiment of the present invention.
Figure 14:
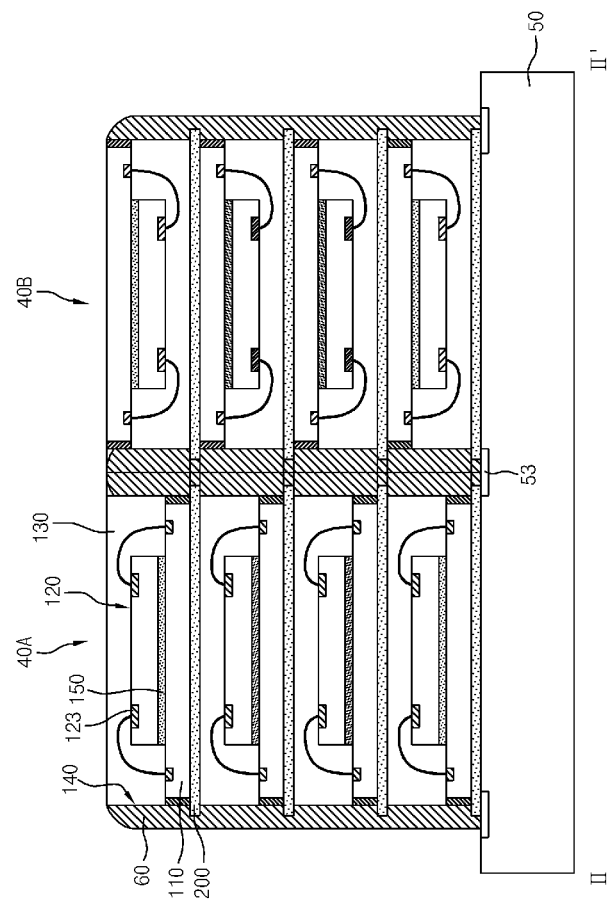
FIG. 14 is a cross-sectional view taken along the line II-II' of FIG. 13.

FIG. 13 is a perspective view illustrating a stacked semiconductor package in accordance with another exemplary embodiment of the present invention, and FIG. 14 is a cross-sectional view taken along the line II-II' of FIG. 13.

Referring to FIGS. 13 and 14, a stacked semiconductor package in accordance with another exemplary embodiment of the present invention includes a plurality of semiconductor package modules 40A, 40B, 40C and 40D, a main substrate 50, and conductive connection members 60.

In the present exemplary embodiment, the stacked semiconductor package includes four semiconductor package modules 40A, 40B, 40C and 40D. The four semiconductor package modules 40A, 40B, 40C and 40D are respectively formed as first through fourth semiconductor package modules, and hereafter, explanations will be made using these terms.

The first through fourth semiconductor package modules 40A, 40B, 40C and 40D are formed on the main substrate 50 in a 2×2 matrix type such that the sides of the first through fourth semiconductor package modules 40A, 40B, 40C and 40D contact with one another. That is to say, the second semiconductor package module 40B is formed neighboring the first semiconductor package module 40A in a first direction, and the third semiconductor package module 40C is formed neighboring the first semiconductor package module 40A in a second direction perpendicular to the first direction. The fourth semiconductor package module 40D is formed neighboring the first semiconductor package module 40A in a diagonal direction.

The first through fourth semiconductor package modules 40A, 40B, 40C and 40D may have the same configuration as the semiconductor package described above in the first exemplary embodiment. Accordingly, repeated descriptions for the same structures will be omitted herein, and the same technical terms and the same reference numerals will be used to refer to the same component elements.

Each of the first through fourth semiconductor package modules 40A, 40B, 40C and 40D has a structure in which semiconductor packages 100 formed with through-holes 140 on respective side surfaces thereof are vertically stacked such that their through-holes 140 connect with one another.

The first through fourth semiconductor package modules 40A, 40B, 40C and 40D are formed adjoining one another such that the through-holes 140 vertically connecting with one another also connect with one another in a horizontal direction.

The main substrate 50 supports the first through fourth semiconductor package modules 40A, 40B, 40C and 40D.

The first through fourth semiconductor package modules 40A, 40B, 40C and 40D are attached to the main substrate 50 with first adhesive members 200 attached to second surfaces 100B of semiconductor packages 100 positioned lowermost.

The main substrate 50 has a third surface 51 which faces the first through fourth semiconductor package modules 40A, 40B, 40C and 40D and a fourth surface 52 which faces away from the third surface 51. Main connection pads 53, which are aligned with the through-holes 140 of the first through fourth semiconductor package modules 40A, 40B, 40C and 40D, are formed on the third surface 51 of the main substrate 50.

The conductive connection members 60 are formed in the through-holes 140 of the first through fourth semiconductor package modules 40A, 40B, 40C and 40D, and electrically connect side pads 113 which are formed in substrates 110 of the semiconductor packages 100 included in the first through fourth semiconductor package modules 40A, 40B, 40C and 40D, with the main connection pads 53 of the main substrate 50.

The conductive connection members 60 are formed by mounting and disposing the semiconductor packages 100 in the vertical and horizontal directions with solder balls inserted into the through-holes 140 and performing a reflow process to melt the solder balls.

While not shown in a drawing, in the case of a semiconductor package 100 which should be electrically isolated from the conductive connection members 60, insulation balls may be inserted, instead of the solder balls, into the through-holes 140 which are formed in the substrate 110 of the corresponding semiconductor package 100 such that the side pads 113 formed in the substrate 110 of the corresponding semiconductor package 100 may be electrically isolated from the conductive connection members 60. Silica balls may be used as the insulation balls.

The through-holes 140, which are formed on the side surfaces of the first through fourth semiconductor package modules 40A, 40B, 40C and 40D, connect with one another in the horizontal direction. Since the first through fourth semiconductor package modules 40A, 40B, 40C and 40D are connected with the main substrate 50 by the conductive connection members 60 which are formed in the through-holes 140, the number of the main connection pads 53 necessary for the main substrate 50 and the number of circuit wiring lines may decrease compared to the known art.

Figure 15A:
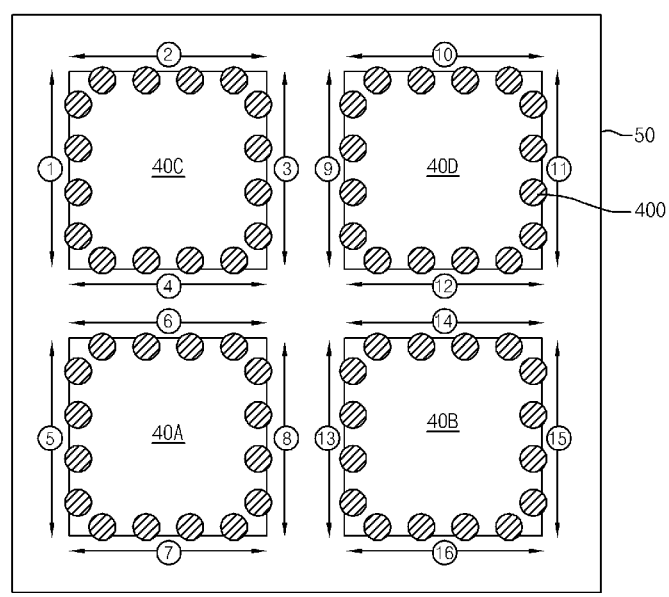
FIGS. 15A and 15B are views explaining effects achieved in the stacked semiconductor package in accordance with another exemplary embodiment of the present invention.
Figure 15B:
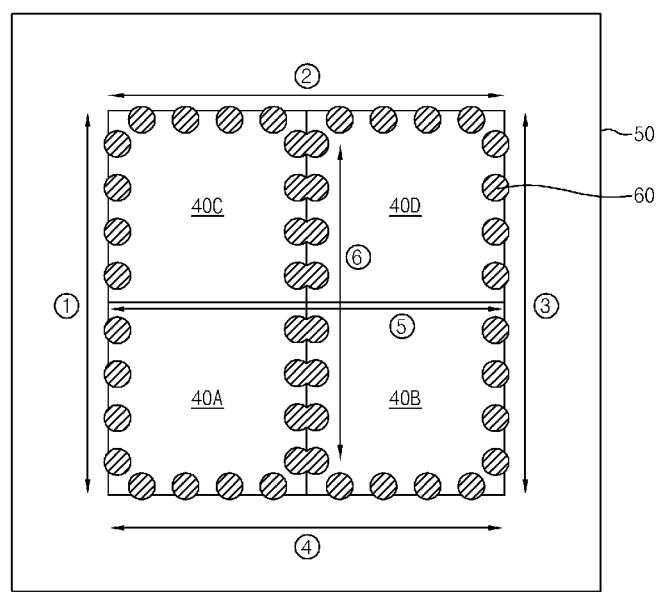

That is to say, in the case where the four semiconductor package modules 40A, 40B, 40C and 40D are separately mounted onto the main substrate 50 as shown in FIG. 15A, the number of circuit wiring lines needed in the main substrate 50 is 16 (=4×4). However, in the case where the four semiconductor package modules 40A, 40B, 40C and 40D are adjacently formed in a 2×2 matrix type such that the through-holes 140 connect with one another in the horizontal direction as shown in FIG. 15B, the number of circuit wiring lines needed in the main substrate 50 is only 6.

As is apparent from the above description, in the present invention, since stacked semiconductor packages are completely attached to one another with adhesive members, the occurrence of warpage in the semiconductor packages may be suppressed. Also, because the stresses induced due to warpage of the semiconductor packages may be alleviated by the adhesive members which have flexibility, the occurrence of cracks in solder balls which are to be used as connection members may be suppressed. Further, since the solder balls which are used as the connection members are formed on the side surfaces of the semiconductor packages, the height of a stacked semiconductor package may decrease.

Moreover, due to the fact that a semiconductor package module is connected with an adjacent semiconductor package module through the connection members, the number of circuit wiring lines needed in a main substrate may decrease.

Although specific exemplary embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package comprising:
    a semiconductor package module including a plurality of semiconductor packages each of which has a first surface, a second surface facing away from the first surface, side surfaces connecting the first surface and the second surface and through-holes formed on the side surfaces to pass through the first surface and the second surface and which are stacked such that their through-holes vertically connect with one another, and adhesive members which are formed between the semiconductor packages and attach the semiconductor packages to one another, wherein the adhesive members are formed to partially cover cross-sections of the through-holes which are open on the first surface and the second surface of the semiconductor packages;
    a main substrate supporting the semiconductor package module and formed, on a third surface thereof facing the semiconductor package module, with main connection pads which are aligned with the through-holes; and
    conductive connection members formed in the through-holes and electrically connecting the semiconductor packages with the main connection pads.

2. The stacked semiconductor package according to claim 1, wherein each of the semiconductor packages comprises:
    a substrate having a fifth surface, a sixth surface facing away from the fifth surface and sides surfaces connecting the fifth surface and the sixth surface, formed with connection pads on the fifth surface, and formed with the through-holes on the side surfaces;
    a semiconductor chip placed on the substrate and having bonding pads which are connected with the connection pads; and
    a mold part sealing the fifth surface of the substrate including the semiconductor chip and formed with the through-holes on side surfaces thereof.

3. The stacked semiconductor package according to claim 2, wherein the substrate includes side pads which are formed on inner walls of the through-holes formed on the side surfaces of the substrate.

4. The stacked semiconductor package according to claim 1, wherein the through-holes have the shape of a circular column or a prism with at least three sides.

5. The stacked semiconductor package according to claim 1, wherein an open width of the through-holes, by which the through-holes are open on the side surfaces of the semiconductor package, has a size that is smaller than an inner diameter of the through-holes.

6. The stacked semiconductor package according to claim 5, wherein the open width of the through-holes has a size that corresponds to approximately 10% to 50% of the inner diameter of the through-holes.

7. The stacked semiconductor package according to claim 1, wherein the adhesive members are formed as flexible adhesive sheets.

8. The stacked semiconductor package according to claim 7, wherein the adhesive members are formed using any one of a WBL (wafer backside lamination) film, a spacer tape, and a prepreg.

9. The stacked semiconductor package according to claim 1, wherein the adhesive members are formed to cover approximately 20% to 50% of the cross-sections of the through-holes.

10. The stacked semiconductor package according to claim 1, wherein the conductive connection members are formed using solder balls.

11. A method for manufacturing a stacked semiconductor package, comprising the steps of:
    forming a plurality of semiconductor packages each having a first surface, a second surface facing away from the first surface and side surfaces connecting the first surface and the second surface, and formed, on the side surfaces, with through-holes which pass through the first surface and the second surface;
    attaching first adhesive members to second surfaces of the semiconductor packages in such a way as to partially cover cross-sections of through-holes which are open on the second surfaces of the semiconductor packages;
    inserting solder balls into the through-holes;
    stacking the semiconductor packages on a main substrate formed with main connection pads such that the through-holes of the semiconductor packages vertically connect with one another; and
    reflowing the solder balls and thereby forming conductive connection members which electrically connect the semiconductor packages with the main connection pads.

12. The method according to claim 11, wherein the through-holes are formed through drilling process or a laser drilling process.

13. The method according to claim 11, wherein the adhesive members are formed to cover approximately 20% to 50% of the cross-sections of the through-holes which are open on the second surfaces of the semiconductor packages.

* * * * *